(12) United States Patent
Laitinen et al.

(10) Patent No.: US 9,001,045 B2
(45) Date of Patent: Apr. 7, 2015

(54) COST EFFICIENT ELEMENT FOR COMBINED PIEZO SENSOR AND ACTUATOR IN ROBUST AND SMALL TOUCH SCREEN REALIZATION AND METHOD FOR OPERATION THEREOF

(75) Inventors: Pauli Laitinen, Helsinki (FI); Juhani Tuovinen, Espoo (FI)

(73) Assignee: Nokia Corporation, Espoo (FI)

( * ) Notice: Subject to any disclaimer, the term of this patent is extended or adjusted under 35 U.S.C. 154(b) by 1996 days.

(21) Appl. No.: 11/270,401

(22) Filed: Nov. 8, 2005

(65) Prior Publication Data

US 2007/0103449 A1 May 10, 2007

(51) Int. Cl.
*G06F 3/041* (2006.01)
*G06F 3/01* (2006.01)
*H01L 41/08* (2006.01)

(52) U.S. Cl.
CPC .............. *G06F 3/016* (2013.01); *G06F 3/0414* (2013.01); *H01L 41/0825* (2013.01)

(58) Field of Classification Search
CPC ................................ G06F 3/016; G06F 3/0414
USPC .............................. 345/173, 174; 310/316.01
See application file for complete search history.

(56) References Cited

U.S. PATENT DOCUMENTS

| | | | | |
|---|---|---|---|---|
| 4,758,165 A | * | 7/1988 | Tieman et al. | 434/114 |
| 5,034,645 A | * | 7/1991 | Woodruff et al. | 310/316.01 |
| 5,389,849 A | * | 2/1995 | Asano et al. | 310/323.21 |
| 5,589,828 A | * | 12/1996 | Armstrong | 341/20 |
| 5,621,178 A | * | 4/1997 | Van Pelt et al. | 73/862.61 |
| 5,760,530 A | * | 6/1998 | Kolesar | 310/339 |
| 6,204,832 B1 | * | 3/2001 | Melville et al. | 345/55 |
| 6,252,334 B1 | * | 6/2001 | Nye et al. | 310/328 |
| 6,429,846 B2 | * | 8/2002 | Rosenberg et al. | 345/156 |
| 6,492,979 B1 | * | 12/2002 | Kent et al. | 345/173 |
| 6,822,635 B2 | * | 11/2004 | Shahoian et al. | 345/156 |
| 7,336,266 B2 | * | 2/2008 | Hayward et al. | 345/179 |
| 2002/0033795 A1 | * | 3/2002 | Shahoian et al. | 345/156 |
| 2002/0144886 A1 | | 10/2002 | Engelmann et al. | 200/600 |
| 2002/0149561 A1 | * | 10/2002 | Fukumoto et al. | 345/156 |
| 2003/0038776 A1 | * | 2/2003 | Rosenberg et al. | 345/156 |
| 2003/0127944 A1 | | 7/2003 | Clark et al. | 310/316.01 |
| 2003/0174121 A1 | * | 9/2003 | Poupyrev et al. | 345/156 |
| 2003/0231170 A1 | * | 12/2003 | Yoshikawa et al. | 345/173 |
| 2004/0164971 A1 | * | 8/2004 | Hayward et al. | 345/179 |
| 2005/0134574 A1 | | 6/2005 | Hill | 345/173 |
| 2005/0160777 A1 | * | 7/2005 | Baechle et al. | 70/276 |
| 2006/0028095 A1 | * | 2/2006 | Maruyama et al. | 310/316.01 |
| 2006/0181522 A1 | * | 8/2006 | Nishimura et al. | 345/177 |
| 2007/0043451 A1 | * | 2/2007 | Geyer | 700/42 |

FOREIGN PATENT DOCUMENTS

| | | |
|---|---|---|
| EP | 1544720 A1 | 6/2005 |
| JP | 57-186836 | 11/1982 |
| JP | 06-139018 A | 5/1994 |
| JP | 11-212725 A | 8/1999 |
| JP | 2000-065631 A | 3/2000 |

(Continued)

*Primary Examiner* — Claire X Pappas
*Assistant Examiner* — Robert Stone
(74) *Attorney, Agent, or Firm* — Harrington & Smith

(57) ABSTRACT

A device comprising a piezo element includes a piezo-electric material the piezo element including a piezo actuator, and at least one piezo sensor coupled to the piezo actuator, wherein the piezo actuator and the at least one piezo sensor include a common element.

32 Claims, 2 Drawing Sheets

(56) References Cited

FOREIGN PATENT DOCUMENTS

| | | |
|---|---|---|
| JP | 2001-156352 | 6/2001 |
| JP | 2001-156352 A | 6/2001 |
| JP | 2002-031574 A | 1/2002 |
| JP | 30-85481 | 2/2002 |
| JP | 2002-048552 A | 2/2002 |
| WO | WO-93/24963 A1 | 12/1993 |
| WO | WO2005067073 * 7/2005 | ............. B60C 23/04 |

* cited by examiner

COST EFFICIENT ELEMENT FOR COMBINED PIEZO SENSOR AND ACTUATOR IN ROBUST AND SMALL TOUCH SCREEN REALIZATION AND METHOD FOR OPERATION THEREOF

TECHNICAL FIELD

This invention relates generally to a combined piezo sensor and actuator for use with display devices.

BACKGROUND

A touchscreen is a monitor, typically based either on Liquid Crystal Display (LCD) or Cathode Ray Tube (CRT) technology, that accepts direct screen input. The ability to accept screen input is facilitated by an external device, such as a light pen, or an internal device, such as a touch overlay and controller, that relays the X,Y coordinates of a screen interaction to a computer controlling the screen display.

Resistive LCD touch screen monitors and displays rely on a touch overlay, composed of a flexible top layer and a rigid bottom layer separated by insulating dots, attached to a touch-screen controller. Typically, the inside surface of each of the two layers is coated with a transparent metal oxide coating (ITO) that facilitates a gradient across each layer when voltage is applied. Pressing the flexible top sheet creates electrical contact between the resistive layers, producing a switch closing in the circuit. Control electronics coupled to the overlay alternate voltage between the layers and pass the resulting X and Y touch coordinates to the touchscreen controller. The touchscreen controller data is then passed on to the computer operating system for processing.

Resistive touchscreen technology possesses many advantages over other alternative touchscreen technologies, such as acoustic wave, capacitive, Near Field imaging, and infrared. Being highly durable, resistive touchscreens are less susceptible to contaminants that can adversely affect acoustic wave touchscreens. In addition, resistive touchscreens are less sensitive to the effects of scratches that can render resistive touchscreens inoperative. For industrial applications, resistive touchscreens are more cost effective than Near Field imaging touchscreens.

It is becoming increasingly common for portable electronic devices to make use of touch screen technology when providing a display. In such instances, a user typically presses upon the display, such as with a finger or other implement, to input data or make a selection from amongst data displayed on the touch screen. Resistive touch screen technology is often used to determine finger position on the screen. Capacitive finger position technology is increasingly utilized but requires careful calibration to distinguish between a "finger on the display" condition and a "click" event. In either case, active tactility is required for a proper user experience. By "active tactility", it is meant that the display provides tactile feedback to a user to transmit information related to the input or selection of data. Absent such a tactile response, it can be difficult for a user to ascertain if an intended input or selection was registered by the device.

Traditional methods for providing tactile feedback include the physical construction of entry keys to provide a "click" upon successful engagement as well as piezo-electric elements to provide a return force or vibration in the event that a key is successfully pressed. When combined, it is common for the touch screen displays and tactile feedback elements to form separate, if complimentary, systems.

The requirements of implementing a touch screen display and a separate active tactile feedback in mobile electronic devices are often too demanding when employing traditional solutions. For example, the presence of a tactile feedback layer can add excessive size to a small display. One other drawback associated with traditional touch screens is the degradation of the visual output from the display due to the addition of resistive layers forming the touch sensor.

There therefore exists a need for a system providing both touch screen input ability and tactile feedback that is compact and which is compatible with the display devices of mobile platforms.

SUMMARY OF THE PREFERRED EMBODIMENTS

In accordance with an exemplary embodiment of the invention a device includes a piezo actuator comprising a piezo-electric material, and at least one piezo sensor formed of the piezo-electric material and electrically isolated from the piezo actuator, wherein the piezo actuator and the piezo sensor comprise a generally rectangular expanse.

In accordance with another exemplary embodiment of the invention a mobile device includes a sensor/actuator device having a first and second side including a piezo actuator formed of a piezo-electric material, and at least one piezo sensor formed of the piezo-electric material and electrically isolated from the piezo actuator, a display having a first and second side the first side of the display located in opposition to the first side of the sensor/actuator device, and a processor coupled to the piezo actuator and the at least one piezo sensor, wherein each of the sensor/actuator device and the display form a generally rectangular expanse.

In accordance with another exemplary embodiment of the invention a method includes providing a sensor/actuator device having a first and second side including a piezo actuator formed of a piezo-electric material, and at least one piezo sensor formed of the piezo-electric material and electrically isolated from the piezo actuator, providing a display having a first and second side the first side of the display located in opposition to the first side of the sensor/actuator device, wherein each of the sensor/actuator device and the display form a generally rectangular expanse, detecting an activation of the at least one piezo sensor in response to a force applied to the display, and operating the piezo actuator to provide tactile feedback in response to the activation of the piezo sensor.

In accordance with another exemplary embodiment of the invention a program of machine-readable instructions, tangibly embodied on an information bearing medium and executable by a digital processor, performs actions directed toward interacting with a sensor/actuator device, the actions comprising receiving an input signal indicative of a pressure applied to at least one piezo sensor formed of a piezo-electric material, the at least one piezo sensor being electrically isolated from a coplanar piezo actuator formed of the piezo-electric material, processing the input signal to determine an activation of the at least one piezo sensor, and operating the piezo actuator in response to the activation of the at least one piezo sensor.

BRIEF DESCRIPTION OF THE DRAWINGS

The foregoing and other aspects of these teachings are made more evident in the following Detailed Description, when read in conjunction with the attached Drawing Figures, wherein.

DETAILED DESCRIPTION

In an exemplary embodiment of the present invention, there is provided a combined piezo sensor and piezo actuator device. The piezo sensors utilize a piezo element to generate an electrical signal in response to physical pressure, such as the force exerted by a user's finger, so as to detect user input. The piezo actuator utilizes a similar piezo element to provide tactile feedback, such as vibration, to a user of the device. Preferably, both the piezo sensors and the piezo actuator are fabricated from a single piezo-electric element so as to be both coplanar and electronically isolated from one another. The difference in operation between the piezo sensors and the piezo actuator is achieved through a coupling of the piezo sensors and the piezo actuator to a voltage source and a differential voltage measurement device respectively as described more fully below.

Figure 1A:
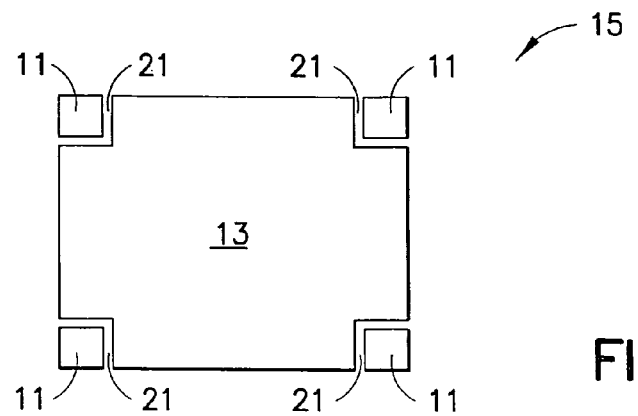
FIG. 1a. is a top view of an exemplary embodiment of a sensor/actuator device of the invention.
Figure 1B:
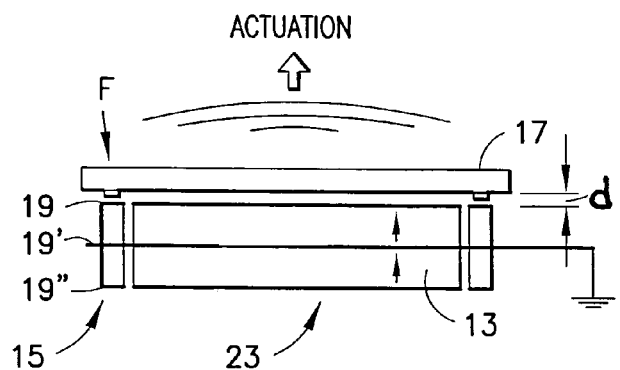
FIG. 1b. is a side view of an exemplary embodiment of a sensor/actuator device of the invention and a display device.

With reference to FIGS. 1a-1b, there is illustrated an exemplary embodiment of a sensor/actuator device 15 according to the invention. The sensor/actuator device 15 may form, but is not limited to, a display device, touch pads, and keypads. FIG. 1a is a top view of the sensor/actuator device 15. Sensor/actuator device 15 is formed of a piezo actuator 13 about which is disposed at least one piezo sensor 11. As the sensor/actuator device 15 will be situated below a display device, such display devices being typically of a generally rectangular construction, the sensor/actuator device 15 is likewise preferred to be of a generally rectangular shape.

The sensor/actuator device 15 is preferably formed of a single piece of piezo-electric material forming a single piezo element 23. Preferred piezo-electric materials include, but are not limited to, serial and parallel bimorph piezo-electric materials. To form the piezo-electric material, piezoceramics can be deposited onto a metal sheet functioning as a middle electrode of the bimorph structure using a sintering process. During production, a masking operation can be performed to isolate the piezo sensors 11 from the piezo actuator 13. The mask can be a mechanical frame covering the areas to be isolated during a sintering process. This isolation results in piezo sensors 11 which are electrically isolated from the piezo actuator 13 while remaining structurally coupled via a ground electrode 19'. Such an isolation can be achieved through a physical isolation in the form of a gap 21 formed between each of the piezo sensors 11 and the piezo actuator 13. In addition, post fabrication, but before poling the piezo-electric material, an electrical insulator can be deposited into the gaps 21 to maintain the electrical isolation of the piezo sensors 11 from the piezo actuator 13. In addition, isolated areas can be produced by depositing a dielectric material over the areas. The dielectric material survives the sintering process. In another exemplary embodiment, the piezo sensors 11 and piezo actuator 13 can be isolated from each other through a process of etching or otherwise mechanically removing the piezo material between them. Typically, after performing the poling, procedures requiring high temperatures or mechanical stresses are to be avoided as they can degrade the piezo-electricity of the element.

As illustrated, there are four piezo sensors 11 fabricated into the sensor/actuator device 15. These piezo sensors 11 are generally rectangular in shape and are located about a periphery of, or proximate, the piezo actuator 13. Specifically, the piezo sensors 11 are located in the corners of the generally rectangular sensor/actuator device 15. The piezo actuator 13 extends in continuous fashion between the piezo sensors 11 covering the remainder of the generally rectangular expanse of sensor/actuator device 15. The invention, however, is not so limited. Rather the invention is drawn to broadly encompass any number of piezo sensors 11 electrically isolated from a piezo actuator 13 and structurally coupled via a ground electrode 19' whereby the piezo sensors 11 and the piezo actuator 13 reside in the same general plane. For example, a single piezo sensor 11 can be entirely surrounded by the piezo actuator 13 and separated by a gap.

As noted above, it is preferred that the combination of the piezo actuator 13 and the piezo sensors 11 combine to form a generally rectangular shape as the sensor/actuator device 15 is intended to correspond to the general size and shape of a display. In addition, as will be made clear below, the electrical connections required to operate the sensor/actuator device 15 are most efficiently realized when the piezo sensors 11 are located about the periphery of the sensor/actuator device 15.

With reference to FIG. 1b, there is illustrated a side view of an exemplary embodiment of the sensor/actuator device 15 of the invention. As is evident, both the piezo actuator 13 and piezo sensors 11 are formed of a single piezo element 23. In the present example, the piezo element 23 is a parallel bimorph piezo element 23 formed with three electrodes 19. Electrodes 19, 19" are coupled to opposing outer surfaces of the piezo element 23, while electrode 19' extends through and divides the piezo element 23 into two pieces and is coupled to ground. There is further illustrated display 17. Display 17 may be any display device capable of presenting visual information in the form of an image upon display 17 and flexible enough to allow a pressure applied to an outer surface of the display 17 to generate an electrical output from the piezo sensors 11 as described more fully below. Typical displays 17 include, but are not limited to, liquid crystal displays (LCDs).

As discussed above, the sensor/actuator device 15 is preferably approximately the same size and shape as the display under which it rests. Display 17 is therefore illustrated as extending across an expanse, in two dimensions exclusive of a thickness, approximately equal to the expanse over which the sensor/actuator device 15 extends. Typical dimensions of thickness for the sensor/actuator device 15 range from approximately 0.3 to 0.7 mm. A side of display 17 is separated from a side of the sensor/actuator device 15 by a distance d. In operation, and as depicted, the distance d is of a value sufficiently small so as to allow a force F applied to an outer surface of the display 17 to be transmitted to a piezo sensor 11 to an extent great enough to be sensed as described below. Conversely, the display 17 provides sufficient flexibility to allow vibrations generated by the piezo actuator 13 to pass through the display 17 to be sensed by a user. Display 17 can also reside such that a side of display 17 rests in contact with a side of the sensor/actuator device 15. In such an instance, the distance d is approximately equal to zero.

Figure 2:
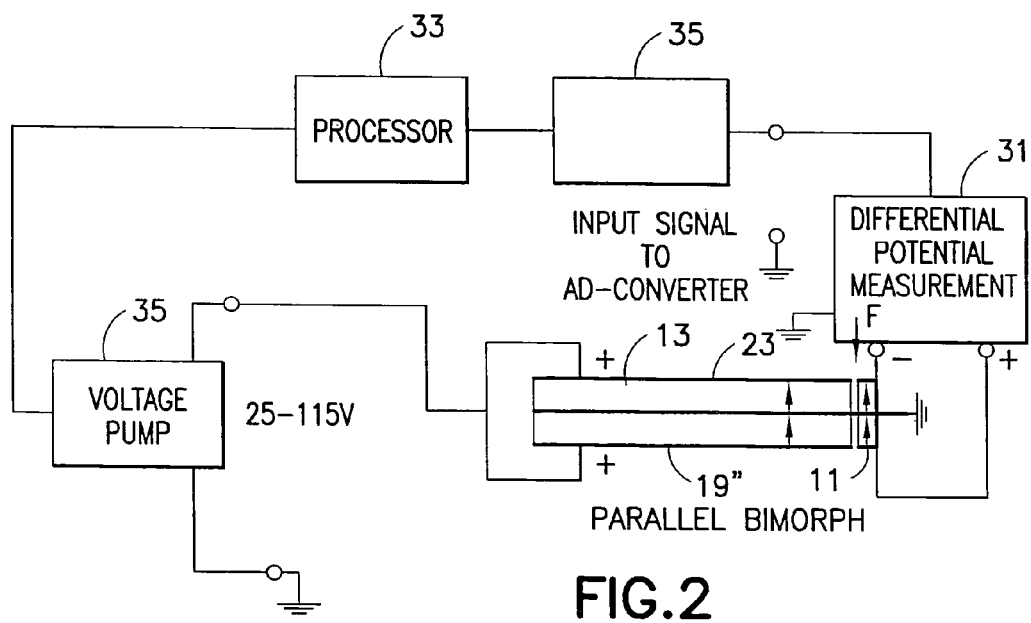
FIG. 2. is a diagram of an exemplary embodiment of the circuit connections for configuring a sensor/actuator of the invention.

With reference to FIG. 2, there is illustrated a wiring diagram of an exemplary embodiment by which the sensor/actuator device 15 of the invention can be operated. It is a property of piezo-electric materials that physical deformation, as occurs when pressure is applied, gives rise to an electrical current. Conversely, when an electrical charge is applied to a piezo-electric material, a physical deformation of the piezo-electric material can be induced.

As illustrated, the piezo actuator 13 is coupled to a voltage pump 35 for providing a voltage to the piezo actuator 13. Specifically, voltage pump 35 provides a voltage to the external electrodes 19, 19" of the piezo actuator 13. When a voltage is applied by the voltage pump 35 to the piezo actuator 13, the piezo actuator 13 bends in response. Repeated stressing of the piezo actuator 13 via the application of a plurality of applications of voltage to the piezo actuator 13 will result in a vibration of the piezo actuator 13. Similarly, a single application and cessation of applied voltage to the piezo actuator 13 can approximate the tactile sensation of a "click". In a preferred embodiment, the piezo actuator 13 operates in a 31-mode. A 31-mode actuator 13 produces displacement perpendicular to an electric field applied parallel to the piezo element 23. Typical voltages for application to the piezo actuator 13 operating in a portable electronic device range from approximately 25 volts to approximately 185 volts.

Similarly, as illustrated, each piezo sensor 11 is coupled to a differential potential measurement device 31 for measuring a differential electrical potential formed across the piezo sensor 11 when physically deformed. When a pressure, such as that resulting from a force F, is applied to a piezo sensor 11, a sensor signal is generated. In the exemplary embodiment illustrated, this sensor signal is measured by the differential potential measurement device 31 as the difference between the negative signal (with respect to ground) from a front surface of the piezo sensor 11 (the side closest to display 17) and a positive signal from an opposing rear surface of the piezo sensor 11. Preferably, each piezo sensor 11 is operated in a 33-mode. A 33-mode sensor produces a voltage differential across opposing surfaces when deformed in a direction parallel to the direction of the polarization of the piezo element 23.

There is further illustrated a control device, processor 33, for controlling the operation of the voltage pump 35 and for receiving an output signal from the differential potential measurement device 31 indicative of the activation of a piezo sensor 11. In the embodiment shown, an A/D converter is coupled to both the differential potential measurement device 31 and the processor 33 for converting the analog signal of the differential potential measurement device 31, indicative of the force applied to a piezo sensor 11, to a digital output signal capable of reception by the processor 33.

While only one differential potential measurement device 31 is illustrated, a separate differential potential measurement device 31 is preferably coupled to each individual piezo sensor 11, with the output of each differential potential measurement device 31 coupled to one or more A/D converters similarly coupled to the processor 33. In an exemplary embodiment, each piezo sensor 11 corresponds to an image or to part of an image displayed upon display 17 and intended to be selected. As a result, applying a force to a portion of the display 17 corresponding to a portion of the displayed image to be selected, under which rests a piezo sensor 11, results in a signal being sent to the processor 33 indicative of an activation of the associated piezo sensor 11. In the instance that the processor 33 has access to the image data displayed upon display 17, such as through access to a memory in which the image is stored, the processor 33 can correlate the individual piezo sensor 11 activated to an intended logical selection of an image element, such as a button, by a user.

The processor 33 is any device or element capable of receiving an input, performing actions upon the input, and issuing an output in response thereto. In the exemplary embodiment illustrated, the processor 33 receives an input indicative of the activation of a piezo sensor 11 and issues an output to the voltage pump 35 in response thereto. More specifically, the processor 33 receives a digital input signal from A/D converter 35 when a force F is applied to a piezo sensor 11. The processor 33 can compare the received input signal to a threshold value, either stored internally or in external memory coupled to the processor 33, for determining if the force F applied to the piezo sensor 11 is of sufficient magnitude to indicate an activation of the piezo sensor 11.

If the input signal is deemed to be of sufficient magnitude (greater than or equal to the threshold value), the processor proceeds to instruct the piezo actuator 13 to provide tactile feedback indicative of the activation of a piezo sensor 11. As described above, the voltage pump 35 may be instructed by the processor 33 to provide an output voltage to the piezo actuator 13 of sufficient form and magnitude to produce a single "click" or a vibration of the piezo actuator 13. In this manner, the processor 33 functions to detect the activation of individual piezo sensors 11 in response to the application of pressure upon one or more piezo sensors 11 and to provide tactile feedback thereto.

Figure 3:
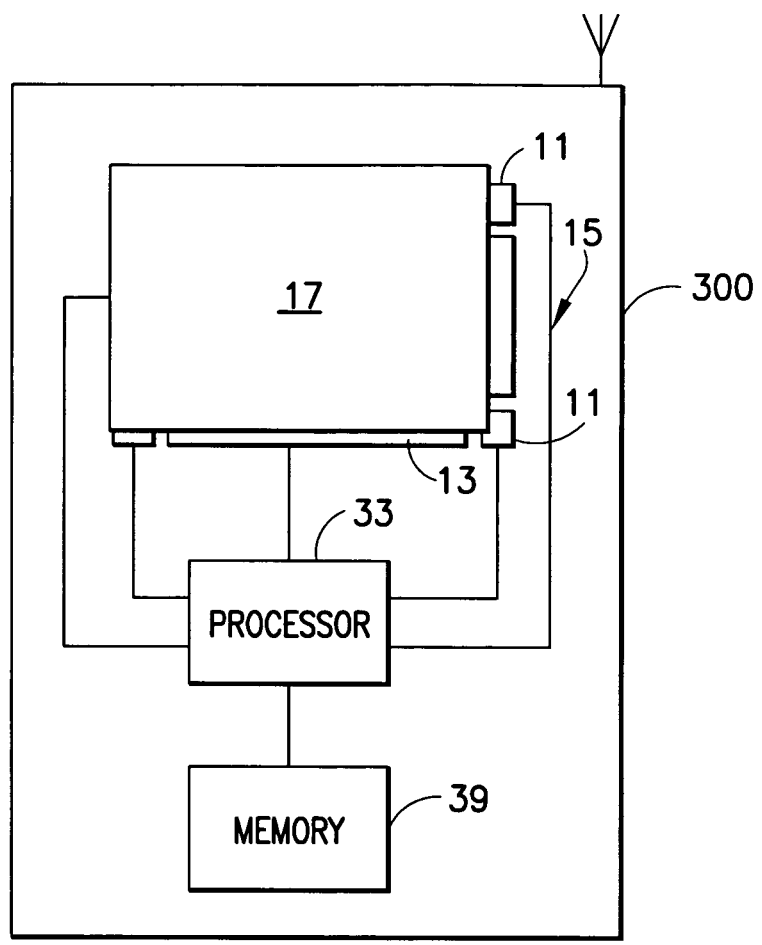
FIG. 3. is a diagram of an exemplary embodiment of a mobile device for practicing the invention.

With reference to FIG. 3, there is illustrated a diagram of an exemplary embodiment of an implementation of the invention in a mobile device or station 300. In a preferred embodiment, mobile device 300 is a mobile telephone. Mobile device 300 is formed of a processor 33. Processor 33 is coupled to the display 17, the piezo sensors 11, the piezo actuator 13, and a memory 39 upon which is stored data required by the processor 33, such as a threshold value.

In general, the various embodiments of the mobile device 300 can include, but are not limited to, cellular telephones, portable electronic devices, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

The embodiments of this invention involving the determination of an activation of a piezo sensor 11 and the subsequent provision of a tactile response via operation of the piezo actuator 13 may be implemented by computer software executable by a data processor of the mobile device 300, such as the processor 33, or by hardware, or by a combination of software and hardware.

The memory 39 may be of any type suitable to the local technical environment and may be implemented using any suitable data storage technology, such as semiconductor-based memory devices, magnetic memory devices and systems, optical memory devices and systems, fixed memory and removable memory. The data processor 33 may be of any type suitable to the local technical environment, and may include one or more of general purpose computers, special purpose computers, microprocessors, digital signal processors (DSPs) and processors based on a multi-core processor architecture, as non-limiting examples.

In general, the various embodiments such as controlling the display 17, the piezo sensors 11, and the piezo actuator 13, may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Certain embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

Although described in the context of particular embodiments, it will be apparent to those skilled in the art that a number of modifications and various changes to these teachings may occur. Thus, while the invention has been particularly shown and described with respect to one or more exemplary embodiments thereof, it will be understood by those skilled in the art that certain modifications or changes may be made therein without departing from the scope and spirit of the invention as set forth above, or from the scope of the ensuing claims.

What is claimed is:

1. A device comprising:
   a piezo element comprising a piezo-electric material, the piezo element comprising:
      a piezo actuator defining a first plane and configured to displace in a first direction perpendicular to the first plane;
      at least one piezo sensor physically isolated from said piezo actuator by a gap formed in the first plane that runs perpendicular to the direction, the at least one piezo sensor arranged such that a touch input sensed at the piezo sensor results in a tactile response at the piezo actuator;
   wherein the piezo actuator and the at least one piezo sensor comprise a common electrode.

2. The device of claim 1 wherein the common electrode comprises a ground electrode that is configured to support the piezo actuator and the at least one piezo sensor substantially in the first plane.

3. The device of claim 1 wherein said piezo element comprises a generally rectangular expanse.

4. The device of claim 1 wherein said at least one piezo sensor is located proximate to a periphery of said piezo actuator.

5. The device of claim 1 wherein at least one of said piezo sensors is located in one of a plurality of corners of said piezo actuator.

6. The device of claim 1 wherein said at least one piezo sensor and said piezo actuator are coplanar.

7. The device of claim 1 wherein said piezo-electric material comprises a bimorph piezo electric material.

8. The device of claim 1 wherein the piezo actuator operates in a mode in which displacement is perpendicular to an applied electric field and the piezo sensor operates in a mode so as to produce a voltage differential across opposing surfaces when deformed in a direction parallel to a direction of polarization of the piezo element.

9. The device of claim 1 wherein said piezo-electric material comprises a thickness between approximately 0.3 mm and 0.7 mm.

10. A mobile device comprising:
    a sensor/actuator device having a first side and a second side comprising:
       a piezo element comprising a piezo-electric material the piezo element comprising:
          a piezo actuator defining a first plane and configured to displace in a first direction perpendicular to the first plane; and
          at least one piezo sensor physically isolated from said piezo actuator by a gap formed in the first plane that runs perpendicular to the direction, the at least one piezo sensor arranged such that a touch input sensed at the piezo sensor results in a tactile response at the piezo actuator;
    a display having a first side and a second side, wherein said first side of said display is located in opposition to said first side of said sensor/actuator device; and
    a processor coupled to said piezo actuator and said at least one piezo sensor.

11. The mobile device of claim 10 wherein the piezo actuator and the at least one piezo sensor comprise a common electrode which comprises a ground electrode that is configured to support the piezo actuator and the at least one piezo sensor substantially in the first plane.

12. The mobile device of claim 10 wherein each of said sensor/actuator device and said display comprise a generally rectangular expanse.

13. The mobile device of claim 10 comprising a differential potential measurement device coupled to said at least one piezo sensor and said processor.

14. The mobile device of claim 10 comprising a voltage pump coupled to said piezo actuator and said processor.

15. The mobile device of claim 10 comprising a memory coupled to said processor and storing a threshold value.

16. The mobile device of claim 10 wherein said at least one piezo sensor is located about a periphery of said piezo actuator.

17. The device of claim 10 wherein each of said at least one piezo sensors is located in one of a plurality of corners of said sensor/actuator device.

18. The mobile device of claim 10 wherein said at least one piezo sensor and said piezo actuator are coplanar.

19. The mobile device of claim 10 wherein said piezo-electric material comprises a bimorph piezo-electric material.

20. The mobile device of claim 10 wherein the piezo actuator operates in a mode in which displacement is perpendicular to an applied electric field and the piezo sensor operates in a mode so as to produce a voltage differential across opposing surfaces when deformed in a direction parallel to a direction of polarization of the piezo element.

21. A method comprising:
    providing a sensor/actuator device having a first side and a second side comprising:
       a piezo element comprising a piezo-electric material the piezo element comprising a piezo actuator and at least one piezo sensor;
       locating the piezo actuator in a first plane such that displacement of the piezo actuator is in a first direction perpendicular to the first plane;
       isolating the at least one piezo sensor physically from said piezo actuator by a gap formed in the first plane that runs perpendicular to the direction;

locating the at least one piezo sensor substantially in the first plane of the piezo actuator;

configuring a ground electrode to divide the piezo element, and further configuring the ground electrode to support the piezo actuator and the at least one piezo sensor substantially in the first plane of the piezo actuator;

providing a display having a first side and a second side, wherein said first side of said display is located in opposition to said first side of said sensor/actuator device;

detecting an activation of said at least one piezo sensor in response to a force applied to said display; and operating said piezo actuator to provide tactile feedback in response to said activation of said piezo sensor.

22. The method of claim 21 wherein each of said sensor/actuator device and said display comprise a generally rectangular expanse.

23. The method of claim 22 wherein said measuring comprises utilizing a differential potential measurement device.

24. The method of claim 22 wherein said detecting further comprising comparing said differential electrical potential to a threshold value.

25. The method of claim 21 wherein said detecting comprises measuring a differential electrical potential across said at least one piezo sensor.

26. The method of claim 21 wherein said operating comprises applying a voltage to said actuator.

27. The method of claim 21 wherein said operating comprises applying a plurality of voltages to said actuator.

28. A device comprising:
a sensor/actuator device having a first side and a second side comprising:
a piezo element comprising a piezo-electric material the piezo element comprising:
a piezo actuator defining a first plane and configured to displace in a first direction perpendicular to the first plane;
at least one piezo sensor physically isolated from said piezo actuator by a gap formed in the first plane that runs perpendicular to the direction;
the at least one piezo sensor being located substantially in the first plane of the piezo actuator;
a display having a first side and a second side, wherein said first side of said display is located in opposition to said first side of said sensor/actuator device;
means for detecting an activation of said at least one piezo sensor in response to a force applied to said display; and
means for operating said piezo actuator to provide tactile feedback in response to said activation of said piezo sensor.

29. The device of claim 28 wherein each of said sensor/actuator device and said display comprise a generally rectangular expanse.

30. The device of claim 28 wherein a ground electrode is configured to divide the piezo element, the ground electrode further configured to support the piezo actuator and the at least one piezo sensor substantially in the first plane of the piezo actuator.

31. The device of claim 28 wherein said means for detecting comprises a processor coupled a memory and a differential potential measurement device, said differential potential measurement device coupled to said at least one piezo sensor.

32. The device of claim 28 wherein said means for operating comprises a voltage pump coupled to said piezo actuator and a processor.

* * * * *